United States Patent
Kidoguchi et al.

(10) Patent No.: US 6,518,082 B1
(45) Date of Patent: Feb. 11, 2003

(54) METHOD FOR FABRICATING NITRIDE SEMICONDUCTOR DEVICE

(75) Inventors: Isao Kidoguchi, Hyogo (JP); Akihiko Ishibashi, Osaka (JP); Masahiro Kume, Shiga (JP); Yuzaburo Ban, Osaka (JP); Satoshi Kamiyama, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/805,767
(22) PCT Filed: Sep. 16, 1999
(86) PCT No.: PCT/JP99/05034
§ 371 (c)(1), (2), (4) Date: Mar. 16, 2001
(87) PCT Pub. No.: WO00/17972
PCT Pub. Date: Mar. 30, 2000

(30) Foreign Application Priority Data

Sep. 17, 1998 (JP) .............................. 10-263625
Jan. 14, 1999 (JP) .............................. 11-007830

(51) Int. Cl.⁷ ............................................. H01L 21/00
(52) U.S. Cl. ......................... 438/46; 438/507; 438/508
(58) Field of Search ........................... 438/46, 47, 507, 438/508, 509, 503, 505

(56) References Cited

U.S. PATENT DOCUMENTS

| | | | |
|---|---|---|---|
| 5,670,411 A | * 9/1997 | Yonehara et al. | 438/459 |
| 5,895,225 A | * 4/1999 | Kidoguchi et al. | 438/46 |
| 5,923,690 A | * 7/1999 | Kume et al. | 257/94 |
| 6,017,774 A | * 1/2000 | Yuasa et al. | 438/46 |
| 6,165,812 A | * 12/2000 | Ishibashi et al. | 438/46 |
| 6,258,617 B1 | * 7/2001 | Nitta et al. | 438/46 |
| 6,265,287 B1 | * 7/2001 | Tsujimura et al. | 438/478 |

FOREIGN PATENT DOCUMENTS

| | | |
|---|---|---|
| EP | 0 772 249 | 5/1997 |
| EP | 10-150219 | 6/1998 |
| EP | 887436 A1 | 12/1998 |
| JP | 3-276786 | 6/1991 |
| JP | 6-177423 | 6/1994 |

(List continued on next page.)

OTHER PUBLICATIONS

Shunji Nakamura et al., "InGaN–Base Multi–Quantum–Well–Structure Laser Diodes", Japanese Journal of Applied Physics Part 2, 1996, vol. 35, No. 1B, L74–L76.

Yasuo Ohba, "Fabrication and Characterization of AlGaN/GaN Double Heterolaser Structures on Sapphire Substrates Using Single Crystalline AlN Buffer Layers", Japanese Journal of Applied Physics Part 2, 1998, vol. 37, No. 8A, L905–L906.

(List continued on next page.)

Primary Examiner—Kevin M. Picardat
(74) Attorney, Agent, or Firm—Nixon Peabody LLP; Donald R. Studebaker (57) ABSTRACT

First, the substrate temperature is set to 1020° C., and an n-type cladding layer (14) made of n-type $Al_{0.1}Ga_{0.9}N$, an n-type optical guide layer (15) made of n-type GaN, and a flatness maintenance layer (16) made of n-type $Al_{0.2}Ga_{0.8}N$ for maintaining the surface flatness of the n-type optical guide layer (15) by suppressing re-evaporation of the constituent atoms of the n-type optical guide layer (15), are grown in this order on a substrate (11) made of sapphire. Then, the supply of a group III material gas is stopped, the substrate temperature is decreased to 780° C., and the carrier gas is switched from a hydrogen gas to a nitrogen gas. Then, an active layer (17) having a multiple quantum well structure is grown by introducing $NH_3$ as a group V source and selectively introducing TMI and TMG as a group III source.

11 Claims, 7 Drawing Sheets

FOREIGN PATENT DOCUMENTS

| JP | 6-196757 | 7/1994 |
| --- | --- | --- |
| JP | 6-196757 A | 7/1994 |
| JP | 2702889 | 9/1995 |
| JP | 8-097149 A | 4/1996 |
| JP | 8-293642 | 11/1996 |
| JP | 8-325094 A | 12/1996 |
| JP | 10-126006 | 5/1998 |
| JP | 10-229217 | 8/1998 |
| JP | 10-303505 | 11/1998 |
| JP | 10-321962 | 12/1998 |
| JP | 11-214788 | 8/1999 |
| JP | 11-261160 | 9/1999 |
| JP | 2000-077783 | 3/2000 |

OTHER PUBLICATIONS

International Search Report dated Dec. 12, 1999.

Notice of Reasons of Rejection, Patent Application No. 11–007830, Mailing No. 141820, Mailing date May 22, 2001.

Notice of Reasons of Rejection, Patent Application No. 11–007830, Mailing No. 246714, Mailing Date Jul. 30, 2002.

* cited by examiner

METHOD FOR FABRICATING NITRIDE SEMICONDUCTOR DEVICE

TECHNICAL FIELD

The present invention relates to a method for fabricating a semiconductor device such as a short wavelength light-emitting device, particularly a GaN-based semiconductor laser device, or the like, which is expected to be used in the field of optical information processing, etc.

BACKGROUND ART

Among the group III–V compound semiconductors, nitride semiconductors containing nitrogen (N) as the group V element are seen to be promising materials of a short wavelength light-emitting device for their relatively large band gap. Among others, so-called nitride semiconductors made of a gallium nitride-based compound semiconductor, e.g., a GaN-based semiconductor of $Al_xGa_yIn_zN$ (where $0 \leq x, y, z \leq 1$, $x+y+z=1$), have been actively researched, and blue or green light-emitting diode devices (LEDs) have been put into practical use. In order to increase the capacity of an optical disk apparatus, there is a strong demand for a semiconductor laser device having a 400 nm band oscillation wavelength. To this end, a semiconductor laser device using a GaN-based semiconductor has been attracting public attention, and the current state of the art of such a semiconductor laser device is close to a practical level.

A conventional GaN-based semiconductor laser device will now be described with reference to the accompanying drawings.

Figure 7:
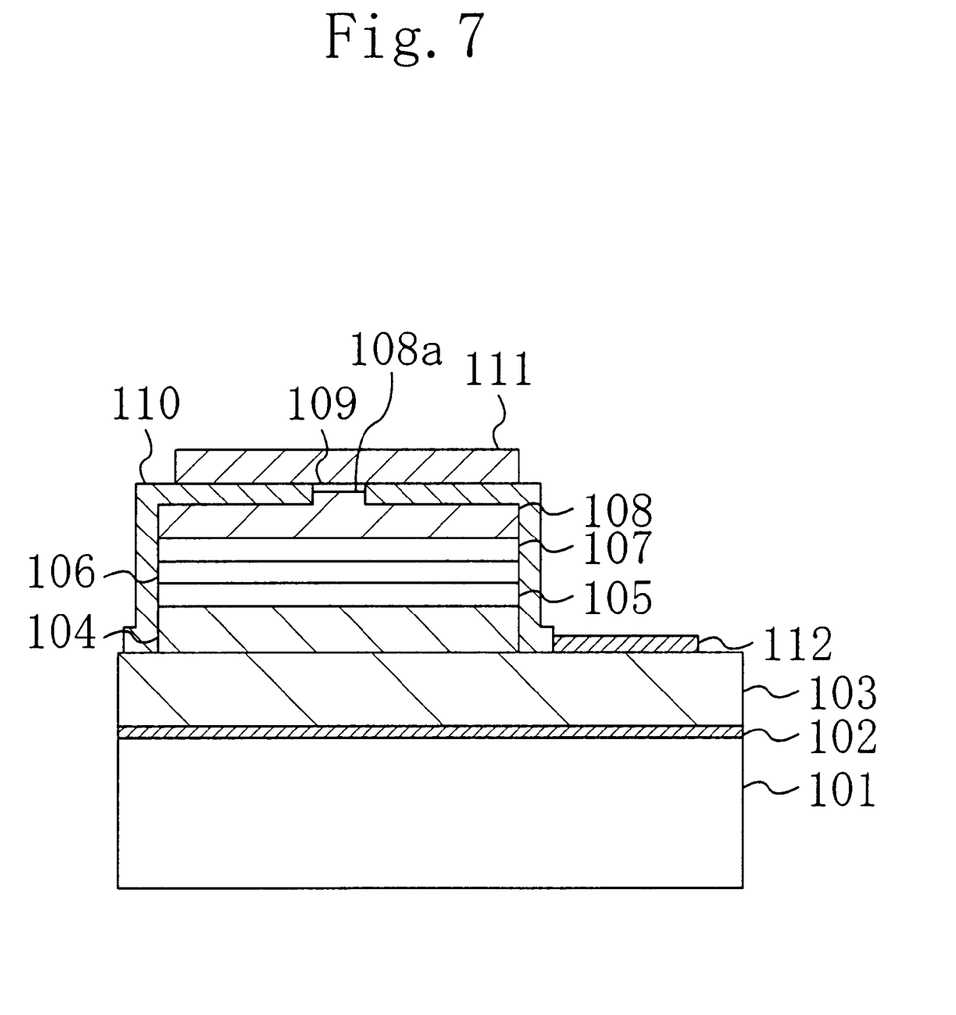
FIG. 7 is a cross-sectional view illustrating a conventional GaN-based quantum well semiconductor laser device.

FIG. 7 is a cross-sectional view illustrating a conventional GaN-based semiconductor laser device which has been confirmed to produce laser oscillation. As illustrated in FIG. 7, a buffer layer 102 made of GaN for reducing the lattice mismatch between a substrate 101 and a GaN-based semiconductor grown on the substrate 101, an n-type contact layer 103 made of n-type GaN which includes a device formation region and an n-side electrode formation region, a first cladding layer 104 made of n-type $Al_{0.07}Ga_{0.93}N$ which is formed in the device formation region of the n-type contact layer 103, a first optical guide layer 105 made of n-type GaN, a multiple quantum well active layer 106 made of a stack of $Ga_{1-x}In_xN/Ga_{1-y}In_yN$ (0<y<x<1), a second optical guide layer 107 made of p-type GaN, a second cladding layer 108 made of p-type $Al_{0.07}Ga_{0.93}N$, and a p-type contact layer 109 made of p-type GaN, are formed in this order on the substrate 101 made of sapphire by using a metal-organic vapor phase epitaxy (MOVPE) method.

A ridge stripe portion 108a whose width is about 3 μm to about 10 μm is formed on the second cladding layer 108, and the p-type contact layer 109 is formed on the ridge stripe portion 108a. The side region of the p-type contact layer 109 and the ridge stripe portion 108a of the second cladding layer 108 and the side surfaces of the epitaxial layers are covered with an insulation film 110.

A p-side electrode 111 made of a stack of Ni/Au, for example, is formed on the insulation film 110 including the p-type contact layer 109 so as to be in contact with the p-type contact layer 109, and an n-side electrode 112 made of a stack of Ti/Al, for example, is formed in the n-side electrode formation region of the n-type contact layer 103.

In a semiconductor laser device having such a structure, when the n-side electrode 112 is grounded and a voltage is applied to the p-side electrode 111, holes and electrons are injected into the multiple quantum well active layer 106 from the p-side electrode 111 side and from the n-side electrode 112 side, respectively. The injected holes and electrons produce an optical gain in the multiple quantum well active layer 106, thereby causing laser oscillation with an oscillation wavelength of about 400 nm. Note, however, that the oscillation wavelength varies depending upon the composition or thickness of the stack of $Ga_{1-x}In_xN/Ga_{1-y}In_yN$ forming the multiple quantum well active layer 106. At present, there has been realized a semiconductor laser device of this structure capable of continuous-wave oscillation at room temperature or higher.

It is disclosed that in order to grow a GaN-based semiconductor containing In, i.e., a semiconductor made of GaInN, by using an MOVPE method, it is preferred to set the crystal growth temperature to about 800° C. and to use a nitrogen ($N_2$) gas as a carrier gas (Applied Physics Letters, vol. 59, p. 2251, 1991). On the other hand, for a semiconductor layer containing no In such as the cladding layer 104, 108 made of $Al_{0.07}Ga_{0.93}N$, the optical guide layer 105, 107 made of GaN, or the like, it is typical that the growth temperature is as high as 1000° C. or higher and a hydrogen ($H_2$) gas is used as the carrier gas. The series of growth processes are described in detail in, for example, Japanese Laid-Open Patent Publication No. 6-196757 or Japanese Laid-Open Patent Publication No. 6-177423.

The outline of the processes will be described below.

First, the substrate 101 is held in a reaction chamber, and a heat treatment is performed by increasing the substrate temperature to 1050° C. while introducing an $H_2$ gas. Next, after the substrate temperature is decreased to 510° C., ammonia ($NH_3$) and trimethylgallium (TMG), which are reaction gases, are introduced onto the substrate 101, thereby growing the buffer layer 102 made of GaN.

Then, the introduction of TMG is stopped and the substrate temperature is increased to 1030° C., and TMG and monosilane ($SiH_4$) are introduced, with an $H_2$ gas as a carrier gas, thereby growing the n-type contact layer 103 made of n-type GaN, after which trimethylaluminum (TMA) is added as a group III material gas containing Al, thereby successively growing the first cladding layer 104 made of n-type $Al_{0.07}Ga_{0.93}N$.

Then, the supply of the material gasses is stopped, and the substrate temperature is decreased to 800° C. Then, the carrier gas is switched from an $H_2$ gas to an $N_2$ gas, and TMG and trimethylindium (TMI) are introduced as group III material gases, thereby forming the multiple quantum well active layer 106 made of a stack of $Ga_{1-x}In_xN/Ga_{1-y}In_yN$.

Then, the supply of the group III material gas is stopped, and the substrate temperature is increased again to 1020° C., while the carrier gas is switched back from an $N_2$ gas to an $H_2$ gas, and TMG, TMA and cyclopentadienylmagnesium ($Cp_2Mg$), or the like, as a p-type dopant are introduced, thereby successively growing the second optical guide layer 107 made of p-type GaN, the second cladding layer 108 made of p-type $Al_{0.07}Ga_{0.93}N$ and the p-type contact layer 109 made of p-type GaN.

In the heating step after the formation of the active layer, a protection layer made of GaN (Japanese Laid-Open Patent Publication No. 9-186363) or a protection layer made of $Al_{0.2}Ga_{0.8}N$ (e.g., Japanese Journal of Applied physics, Vol. 35, p. L74, 1996) may be formed in order to prevent re-evaporation of In from the multiple quantum well active layer 106.

However, in the conventional GaN-based semiconductor laser device as described above, a deterioration in the quality of the n-type contact layer 103 made of n-type GaN or the first cladding layer 104 made of n-type $Al_{0.07}Ga_{0.93}N$ (note that the Al content is 0.1 in Japanese Laid-Open Patent Publication No. 6-196757 or Japanese Laid-Open Patent Publication No. 6-177423) to be the underlying layer for growing the multiple quantum well active layer 106 thereon causes a deterioration in the crystal quality of the multiple quantum well active layer 106 to be grown thereon, thereby leading to problems such as a deterioration in the light-emitting efficiency or an increase in the threshold current in the light-emitting diode device or the semiconductor laser device.

The present invention has been made in view of the above-described problems in the prior art, and has an object to improve the crystal quality of an active region or a peripheral region of the active region so as to realize a nitride semiconductor device having desirable operating characteristics.

DISCLOSURE OF THE INVENTION

In order to achieve the above-described object, according to the first invention, there is provided a flatness maintenance layer made of a nitride semiconductor for maintaining the surface flatness of a semiconductor layer by suppressing evaporation of the constituent atoms of the semiconductor layer when the semiconductor layer provided between a substrate and an active layer is formed through crystal growth. Particularly, the flatness maintenance layer is provided between a first semiconductor layer which is grown at a relatively high temperature and a second semiconductor layer which is grown at a temperature lower than that for the first semiconductor layer.

According to the second invention, a group III material gas is switched from one to another between the step of forming the first semiconductor layer and the step of forming the second semiconductor layer, wherein the ambience around the substrate is adjusted to be an ambience having a pressure of 1 atm or higher and containing nitrogen element, e.g., an ammonia gas, or the like, when the introduction of the group III material gas is temporarily stopped or the carrier gas is changed.

The present inventors have conducted various studies for reasons why a GaN-based semiconductor device has a low crystallinity in and around the active region. As a result, the results as set forth below have been obtained.

As a characteristic of the process of growing a type of material containing GaN, the carrier gas carrying the material gas may differ between a layer containing In, e.g., the multiple quantum well active layer 106 illustrated in FIG. 7, and a layer containing no In, e.g., the cladding layer 104 or the guide layer 105 illustrated in FIG. 7. Typically, a nitrogen gas is used as the carrier gas when growing the layer containing In, and a hydrogen gas is used for the layer containing no In. Thus, in order to fabricate a device by providing a stack of multiple layer films as in a semiconductor laser device, it is necessary to switch a carrier gas from one to another for each layer.

Moreover, for the multiple quantum well active layer 106 containing In and the cladding layer 104, or the like, containing no In, it is necessary to reduce the growth temperature for the layer containing In to be lower than that for the layer containing no In in order to suppress the vapor pressure of In.

When the carrier gas is switched from one to another, the supply of the group III material gas is stopped, whereby a so-called equilibrium state is provided where no additional crystal grows on the substrate 101. In the equilibrium state, elimination (re-evaporation) of the constituent atoms from the grown semiconductor layer occurs in a high temperature state such that the substrate temperature is as high as about 1000° C. or under a pressure condition of 1 atm or less. Thus, the crystal quality deteriorates by the elimination of the constituent atoms from the growth interface of the semiconductor crystal in the equilibrium state when the material gas is switched from one to another.

To address the problem, the present inventors have discovered that if a flatness maintenance layer made of a nitride semiconductor containing Al is provided on the surface of the underlying layer, as the first solution for preventing the elimination of the constituent atoms from the growth interface of the GaN-based semiconductor crystal, then the crystal quality of the active layer which is grown on the underlying layer does not deteriorate.

Moreover, it has been discovered that if the ambience around the underlying layer is adjusted to be a pressurized gas ambience containing nitrogen element, as the second solution for preventing the elimination of the constituent atoms from the growth interface of the semiconductor crystal in the equilibrium state when the material gas is switched from one to another, then the crystal quality of the active layer which is grown on the underlying layer does not deteriorate.

Specific solutions will be listed below.

The first method for fabricating a nitride semiconductor device according to the present invention is the first solution, and includes the steps of: forming a semiconductor layer made of a first nitride semiconductor on a substrate; forming, on the semiconductor layer, a flatness maintenance layer made of a second nitride semiconductor for maintaining a surface flatness of the semiconductor layer by suppressing evaporation of constituent atoms of the semiconductor layer; and forming an active layer made of a third nitride semiconductor on the flatness maintenance layer.

According to the first method for fabricating a nitride semiconductor device, the flatness maintenance layer for maintaining the surface flatness of the semiconductor layer by suppressing evaporation of the constituent atoms of the semiconductor layer is formed on the semiconductor layer to be the underlying layer for the active layer before the active layer is formed. Thus, when the active layer is formed on the flatness maintenance layer, the crystallinity of the active layer is maintained at a high level. As a result, it is possible to improve the operating characteristics of the semiconductor device and to ensure the long-term reliability thereof.

In the first method for fabricating a nitride semiconductor device, it is preferred that the second nitride semiconductor includes aluminum, and the third nitride semiconductor includes gallium and indium. In this way, since the vapor pressure of aluminum nitride (AlN) is lower than that of gallium nitride (GaN), as will be described later, the constituent atoms of the flatness maintenance layer are unlikely to be evaporated. As a result, it is possible to reliably protect the semiconductor layer as the underlying layer. Moreover, since the third nitride semiconductor forming the active layer includes indium (In), the energy band gap is narrowed, and it is possible to reliably form a quantum well structure in the third nitride semiconductor The second method for fabricating a nitride semiconductor device according to the present invention is the first solution, and includes the steps of: forming a first semiconductor layer made of a first nitride semiconductor on a substrate at a first growth temperature; forming, on the first semiconductor layer, a flatness maintenance layer made of a second nitride semiconductor for maintaining a surface flatness of the first semiconductor layer by suppressing evaporation of constituent atoms of the first semiconductor layer; and forming a second semiconductor layer made of a third nitride semiconductor on the flatness maintenance layer at a second temperature lower than the first growth temperature.

According to the second method for fabricating a nitride semiconductor device, the flatness maintenance layer for maintaining the surface flatness of the first semiconductor layer is formed on the first semiconductor layer at the first growth temperature, whereby it is possible to suppress evaporation of the constituent atoms of the first semiconductor layer from the surface thereof while the temperature is decreased from the first temperature to the second temperature. Thus, the crystallinity and flatness of the first semiconductor layer are maintained. Therefore, when the second semiconductor layer is formed on the first semiconductor layer, the crystallinity of the second semiconductor layer is maintained at a high level. As a result, assuming, for example, that the second semiconductor layer is the active region, the crystallinity of the active region is maintained at a high level, whereby it is possible to improve the operating characteristics of the semiconductor device and to ensure the long-term reliability thereof.

In the first or second method for fabricating a nitride semiconductor device, it is preferred that the second nitride semiconductor is made of $Al_xGa_{1-x}N$ (where x satisfies $0.1<x\leq1$). In this way, re-evaporation of the constituent atoms from the second nitride semiconductor to be the flatness maintenance layer does not occur, whereby it is possible to reliably suppress evaporation of the constituent atoms of the semiconductor layer made of the first nitride semiconductor and formed under the flatness maintenance layer.

In the first or second method for fabricating a nitride semiconductor device, it is preferred that the second nitride semiconductor is made of $Al_xGa_{1-x}N$ (where x satisfies $0.2\leq x\leq1$). In this way, it is possible to more reliably suppress evaporation of the constituent atoms of the semiconductor layer made of the first nitride semiconductor and formed under the flatness maintenance layer.

In the first or second method for fabricating a nitride semiconductor device, it is preferred that the thickness of the flatness maintenance layer is approximately 0.5 $\mu$m or less. In this way, a crack does not occur in the flatness maintenance layer.

The third method for fabricating a nitride semiconductor device according to the present invention is the second solution, and includes: a first semiconductor layer formation step of introducing a group III material gas and a group V material gas onto a substrate, thereby forming a first semiconductor layer made of a first nitride semiconductor on the substrate; a group III material gas stopping step of stopping the introduction of the group III material gas; and a second semiconductor layer formation step of introducing a group III material gas and a group V material gas onto the first semiconductor layer, thereby forming a second semiconductor layer made of a second nitride semiconductor on the first semiconductor layer, wherein the group III material gas stopping step includes the step of adjusting an ambience around the first semiconductor layer to be an ambience containing nitrogen and having a pressure of 1 atm or higher.

According to the third method for fabricating a nitride semiconductor device, it is possible to suppress evaporation of the constituent atoms of the first semiconductor layer, particularly nitrogen atoms, from the first semiconductor layer. Thus, the crystallinity and flatness of the first semiconductor layer are maintained. Therefore, when the second semiconductor layer is formed on the first semiconductor layer, the crystallinity of the second semiconductor layer is maintained at a high level. As a result, assuming, for example, that the second semiconductor layer is the active region, the crystallinity of the active region is maintained at a high level, whereby it is possible to improve the operating characteristics of the semiconductor device and to ensure the long-term reliability thereof.

The fourth method for fabricating a nitride semiconductor device according to the present invention is the second solution, and includes: a first semiconductor layer formation step of introducing a group III material gas and a group V material gas onto a substrate along with a first carrier gas, thereby forming a first semiconductor layer made of a first nitride semiconductor on the substrate; a carrier gas changing step of changing the first carrier gas to a second carrier gas whose composition is different from that of the first carrier gas; and a second semiconductor layer formation step of introducing a group III material gas and a group V material gas onto the first semiconductor layer along with the second carrier gas, thereby forming a second semiconductor layer made of a second nitride semiconductor on the first semiconductor layer, wherein the carrier gas changing step includes the step of adjusting an ambience around the first semiconductor layer to be an ambience containing nitrogen and having a pressure of 1 atm or higher.

According to the fourth method for fabricating a nitride semiconductor device, it is possible to suppress evaporation of the constituent atoms of the first semiconductor layer, particularly nitrogen atoms, from the first semiconductor layer. Thus, the effects as those of the third method for fabricating a nitride semiconductor device can be obtained.

BRIEF DESCRIPTION OF THE DRAWINGS

FIG. 1(a) to FIG. 1(c) are cross-sectional views illustrating a sequence of steps of a method for fabricating a nitride semiconductor device according to the first embodiment of the present invention.

FIG. 5(a) to FIG. 5(c) are cross-sectional views illustrating a sequence of steps of a method for fabricating a nitride semiconductor device according to the second embodiment of the present invention.

BEST MODE FOR CARRYING OUT THE INVENTION

First Embodiment

The first embodiment of the present invention will now be described with reference to the accompanying drawings.

FIG. 1(a) to FIG. 1(c) and FIG. 2 are cross-sectional views illustrating a sequence of steps of a method for fabricating a semiconductor laser device, which is a nitride semiconductor device, according to the first embodiment of the present invention.

Figure 1A:
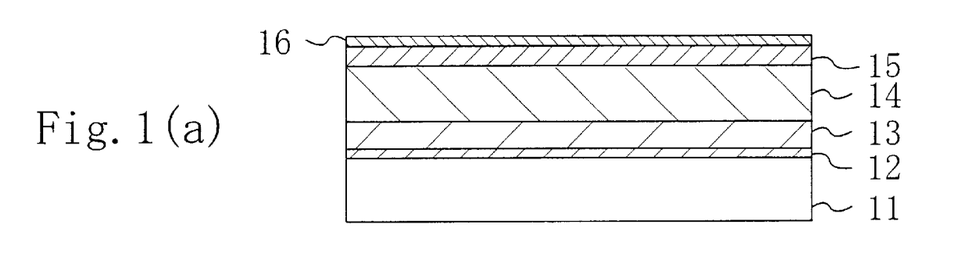

First, referring to FIG. 1(a), using an MOVPE method, a heat treatment at a temperature of about 1000° C. is performed on a substrate 11 made of sapphire which is held in a reaction chamber (not shown), after which the substrate temperature is decreased to 500° C., and a buffer layer 12 made of GaN for reducing the lattice mismatch between the sapphire crystal forming the substrate 11 and the GaN-based semiconductor crystal to be grown on the sapphire crystal and thus suppressing the occurrence of a defect in the GaN-based semiconductor crystal is grown on the substrate 11 by introducing TMG as a group III source and $NH_3$ as a nitrogen source onto the substrate 11 while using primarily an $H_2$ gas as the carrier gas and setting the pressure in the reaction chamber to be about 300 Torr (about 0.4 atm).

Then, the substrate temperature is increased to 1020° C., and $SiH_4$ containing an n-type dopant, TMG as a group III source and $NH_3$ as a nitrogen source are introduced so as to first grow, on the buffer layer 12, an n-type contact layer 13 made of n-type GaN which has a device formation region and an ohmic electrode formation region. Then, TMA is added to the group III source so as to grow an n-type cladding layer 14 made of n-type $Al_{0.1}Ga_{0.9}N$ for forming a potential barrier for an active layer to be described later to confine n-type carriers therein, after which the introduction of TMA is stopped so as to grow an n-type optical guide layer 15 made of n-type GaN for confining light generated in the active layer. Then, TMA is introduced again so as to grow a flatness maintenance layer 16 made of n-type $Al_{0.2}Ga_{0.8}N$ and having a thickness of 20 nm for maintaining the surface flatness of the n-type optical guide layer 15 by suppressing re-evaporation of the constituent atoms of the n-type optical guide layer 15.

Figure 1B:
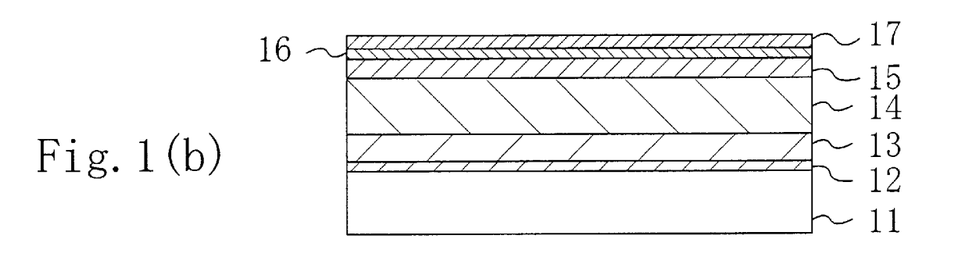

Then, referring to FIG. 1(b), the supply of the group III material gas is stopped, the substrate temperature is decreased to 780° C., and the carrier gas is switched from an $H_2$ gas to an $N_2$ gas. Then, an active layer 17 is grown by using $NH_3$ as a group V source and selectively introducing TMI and TMG as a group III source. Although not shown in the figures, the active layer 17 has a multiple quantum well structure including well layers made of $Ga_{0.8}In_{0.2}N$ and each having a thickness of 2.5 nm which are grown by introducing TMG and TMI, and barrier layers made of GaN and each having a thickness of 6.0 nm which are grown by introducing only TMG. The carrier gas may be an inert gas such as argon (Ar), or the like.

Figure 1C:
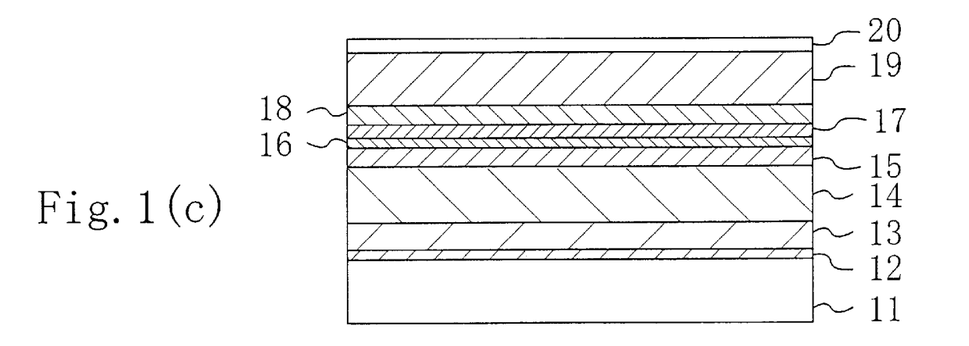

Then, referring to FIG. 1(c), the introduction of the group III material gas and the carrier gas is once stopped, and the substrate temperature is increased to 1020° C. Then, the carrier gas is switched from an $N_2$ gas to an $H_2$ gas, and $Cp_2Mg$ containing a p-type dopant, TMG as a Group III source and $NH_3$ as a nitrogen source are introduced so as to grow, on the active layer 17, a p-type optical guide layer 18 made of p-type GaN for confining light generated in the active layer 17. Then, TMA is added to the group III source so as to grow a p-type cladding layer 19 made of p-type $Al_{0.1}Ga_{0.9}N$ for forming a potential barrier for the active layer 17 to confine p-type carriers therein. Then, the introduction of TMA is stopped again so as to grow Then, referring to FIG. 2, the substrate 11 having the respective epitaxial layers formed thereon is taken out of the reaction chamber, and the p-type contact layer 20 and the p-type cladding layer 19 are etched to form the p-type contact layer 20 and the p-type cladding layer 19 into a ridge stripe shape having a width of about 5 μm. Then, an insulation film 21 made of silicon dioxide ($SiO_2$) is formed on the side walls of the p-type contact layer 20 and the p-type cladding layer 19 and in the region of the upper surface of the p-type optical guide layer 18 beside the p-type contact layer 20 and the p-type cladding layer 19 having the ridge stripe shape.

Figure 2:
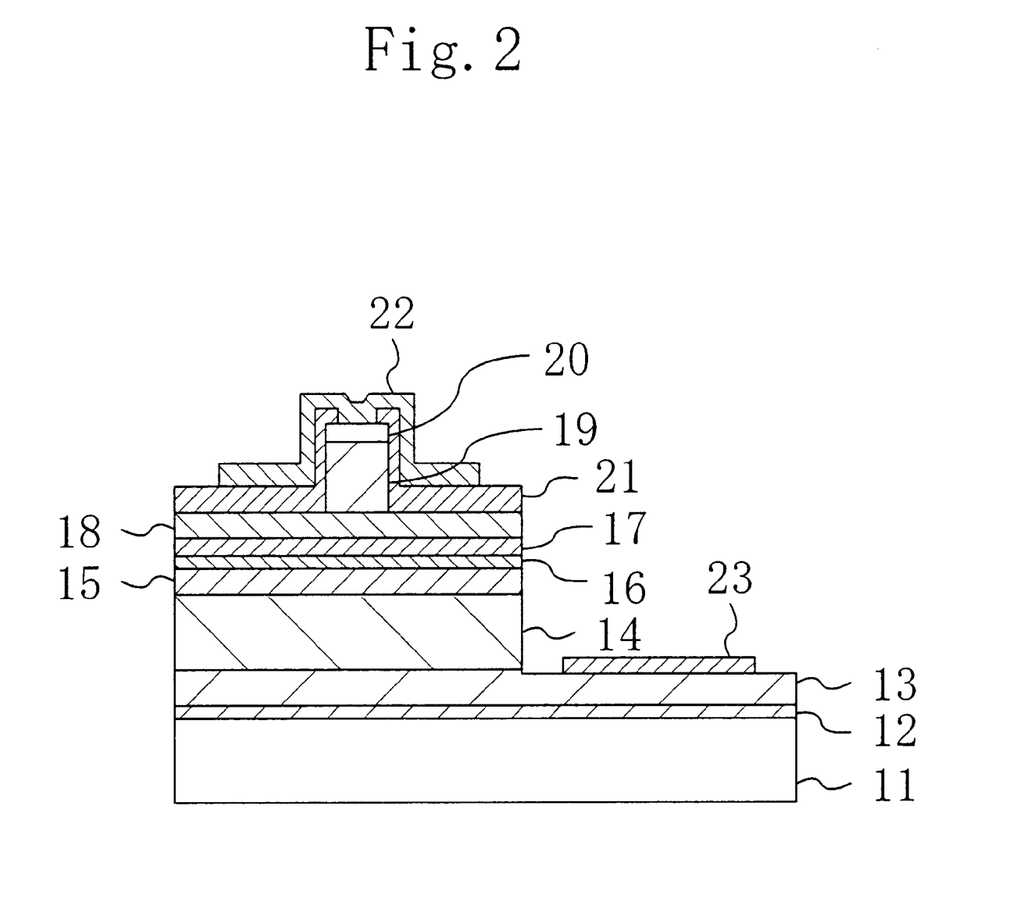
FIG. 2 is a cross-sectional view illustrating a sequence of steps of a method for fabricating a nitride semiconductor device according to the first embodiment of the present invention.

Then, a p-side electrode 22 made of a stack of Ni/Au, for example, is formed by using a vapor deposition method, or the like, in a region including the upper surface of the p-type contact layer 20. After etching is performed while masking the device formation region so as to expose the ohmic electrode formation region of the n-type contact layer 13, an n-side electrode 23 made of a stack of Ti/Al, for example, is formed by using a vapor deposition method, or the like, in the ohmic electrode formation region.

In the thus fabricated semiconductor laser device, when the n-side electrode 23 is grounded and a voltage is applied to the p-side electrode 22, holes and electrons are injected into the active layer 17 from the p-side electrode 22 side and the n-side electrode 23 side, respectively. The injected holes and electrons are recombined with each other to produce an optical gain in the active layer 17, thereby causing laser oscillation with an oscillation wavelength of 405 nm.

Figure 3A:
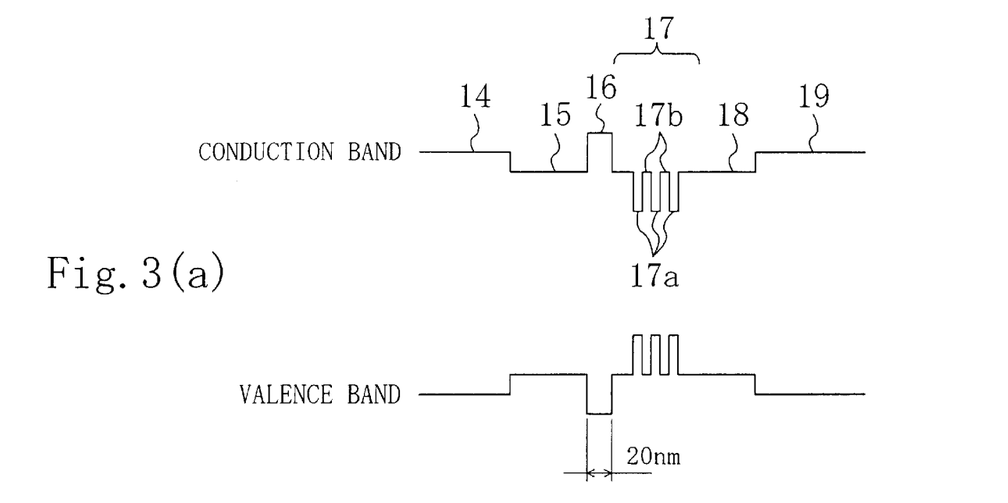
FIG. 3(a) is an energy band diagram of a nitride semiconductor device according to the first embodiment of the present invention.

FIG. 3(a) shows a band diagram in the semiconductor laser device of the present embodiment. In FIG. 3(a), each energy region is denoted by the same reference numeral as the corresponding element shown in FIG. 2. As a characteristic of the present embodiment, the flatness maintenance layer 16 made of a material having an Al content higher than normal, i.e., $Al_{0.2}Ga_{0.8}N$, is provided between the active layer 17, which is made of well layers 17a and barrier layers 17b, and the n-type optical guide layer 15 to be the underlying layer for the active layer 17, as illustrated in FIG. 3(a).

Typically, when a layer having a high Al content is provided under the active layer 17, the mismatch between the lattice constant of AlGaN and the lattice constant of GaN increases since the atomic radius of an Al atom is smaller than that of a Ga atom, and moreover there are a difference in thermal expansion coefficient and other factors, whereby a crack, or the like, may occur in the active layer 17 to adversely influence the device characteristics. In the present embodiment, however, it has been found that it is possible to prevent the occurrence of a crack, or the like, and to improve the crystal quality of the active layer 17 by setting the thickness of the flatness maintenance layer 16 to be relatively small, i.e., 20 nm. It has been confirmed that a crack does not occur in the flatness maintenance layer 16 as long as the thickness of the flatness maintenance layer 16 is about 0.5 μm or less.

The reason why the crystal quality of the active layer 17 is improved when the flatness maintenance layer 16 having an Al content higher than normal is provided under the active layer 17 made of a stack of GaInN/GaN will now be described qualitatively.

Regarding the n-type optical guide layer 15 to be the underlying layer for the active layer 17, the carrier gas is switched from an $H_2$ gas to an $N_2$ gas immediately before the step of growing the active layer 17 containing In is started. Since the relatively high growth temperature for the underlying layer needs to be decreased, the surface of the n-type optical guide layer 15 before growing the active layer 17 is exposed to a high temperature gas without a group III material being supplied. In the case of a GaN crystal layer containing no Al such as the n-type optical guide layer 15 or a crystal layer having an extremely small Al content, e.g., an $Al_{0.1}Ga_{0.9}N$ crystal layer as shown in Japanese Laid-Open Patent Publication No. 6-196757 mentioned above, or the like, a deterioration in crystallinity or a deterioration in flatness occurs due to re-evaporation of the constituent atoms for the surface.

Figure 4:
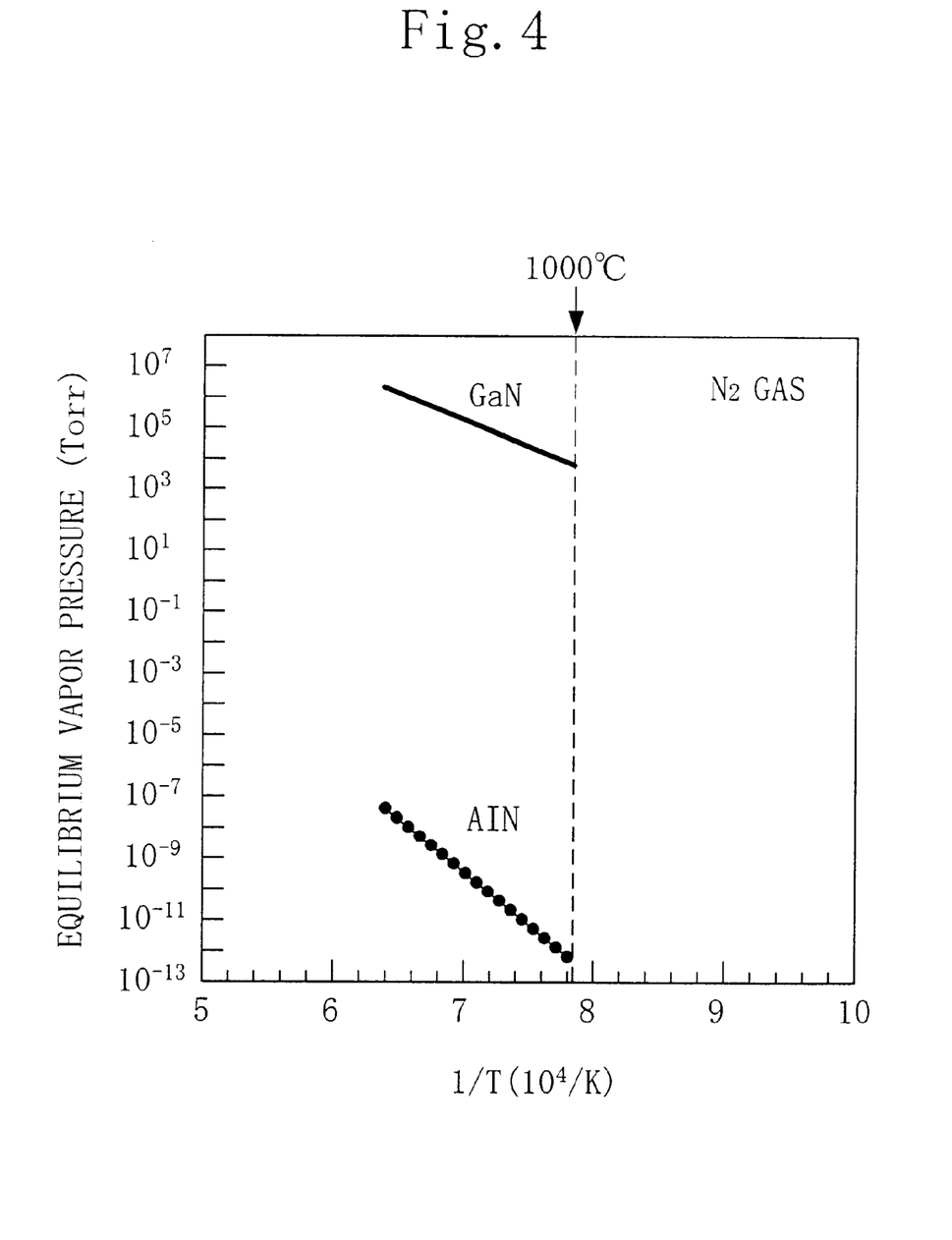
FIG. 4 is a graph illustrating the temperature dependency of the equilibrium vapor pressure of gallium nitride (GaN) and aluminum nitride (AlN) according to the first embodiment of the present invention.

FIG. 4 is a graph illustrating the temperature dependency of the equilibrium vapor pressure (equilibrium vapor pressure curve) of GaN and AlN. The graph shown in FIG. 4 is for a case of a nitrogen ambience, and indicates that GaN cannot stably exist as a solid unless the equilibrium vapor pressure for the temperature of 1000° C. exceeds about 7500 Torr (1 atm is 760 Torr), for example. It is indicated on the other hand that AlN can exist as a solid under a reduced pressure of $10^{-12}$ Torr. The equilibrium vapor pressure curve for an AlGaN mixed crystal will exist between those of GaN and AlN, and AlGaN is stable as a solid even at a high temperature of 1000° C. as the Al content of the AlGaN mixed crystal increases.

Note that a gas such as $NH_3$ exists when actually growing a GaN-based semiconductor layer, whereby the graph tends to be somewhat shifted from the graph of FIG. 4. However, the present inventors have confirmed that there is an effect of suppressing the re-evaporation for an $Al_xGa_{1-x}N$ mixed crystal ($0.1 < x \leq 1$) where the Al content x of AlGaN exceeds 0.1, and that the Al content x is preferably set to 0.2 or more ($0.2 \leq x \leq 1$), whereby it is possible to suppress the re-evaporation and maintain a desirable crystal quality.

As described above, the flatness maintenance layer 16 made of $Al_{0.2}Ga_{0.8}N$ can maintain a desirable crystal quality, whereby the crystal quality of the active layer 17 grown on the flatness maintenance layer 16 is significantly improved from that when the flatness maintenance layer 16 is not provided.

Therefore, a semiconductor laser device in which the flatness maintenance layer 16 made of $Al_{0.2}Ga_{0.8}N$ is provided between the substrate 11 and the active layer 17 has the following characteristics.

(1) The flatness of the interface between the flatness maintenance layer 16 and the semiconductor layer grown on the flatness maintenance layer 16 is improved so as to suppress the In segregation which is often observed in the active layer 17 containing GaInN where the flatness maintenance layer 16 is not provided, thereby reducing the propagation loss of the semiconductor laser device.

(2) In the case of a conventional GaN semiconductor layer, nitrogen vacancy forming a shallower donor level is produced in an amount of about $10^{19} cm^{-3}$ in terms of density, thereby increasing the loss of free carriers of the semiconductor laser device. However, the loss of free carriers can be considerably reduced by providing the flatness maintenance layer 16 of the present embodiment.

As a result of a measurement of the operating characteristics of a semiconductor laser device provided with the flatness maintenance layer 16 as described above, it has been confirmed that the threshold current is reduced to about ½ of that when the flatness maintenance layer 16 is not provided and a substantial improvement in a life test (reliability test) has been observed.

Figure 3B:
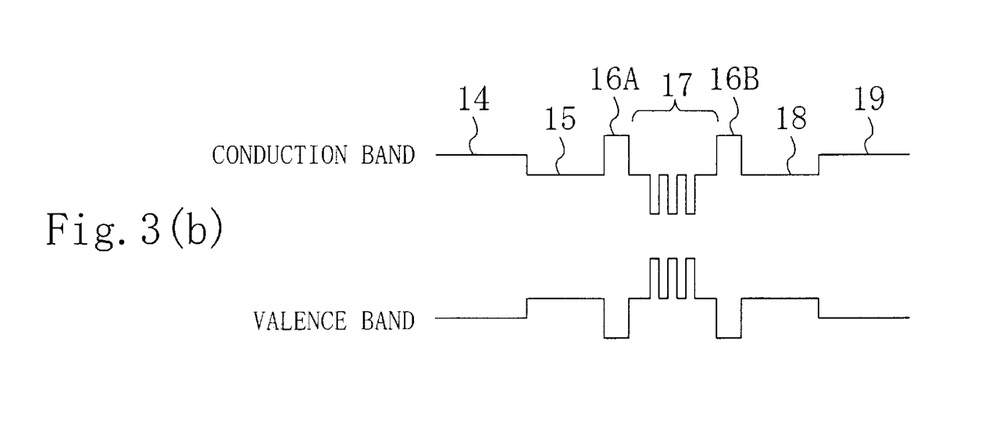
FIG. 3(b) is an energy band diagram of a nitride semiconductor device according to an alternative example of the first embodiment of the present invention.

As illustrated in the band diagram of FIG. 3(a), the flatness maintenance layer 16 of the present embodiment is preferably formed adjacent to the active layer 17. This is because the carrier gas is often switched between the step of growing the active layer 17 containing In and the step of growing a semiconductor layer containing no In. As shown in an alternative example of FIG. 3(b), it may be provided on both sides of the active layer 17. For example, a first flatness maintenance layer 16A may be provided between the n-type optical guide layer 15 and the active layer 17 and a second flatness maintenance layer 16B between the active layer 17 and the p-type optical guide layer 18.

In the present embodiment, a GaN-based semiconductor laser device has been described as an example, but the present invention is not limited to this. Similar effects can be obtained also when forming an active region of a light-emitting diode device, an electronic device, or the like. For example, it is possible to substantially improve the light-emitting efficiency in a light-emitting diode device, or to substantially improve the carrier mobility in an electronic device.

The fabrication method of the present embodiment is not limited to an MOVPE method, but can be applied to any method capable of growing a nitride semiconductor, including a hydride vapor phase epitaxy (H-VPE) method or a molecular beam epitaxy (MBE) method, and the like.

Second Embodiment

The second embodiment of the present invention will now be described with reference to the accompanying drawings.

FIG. 5(a) to FIG. 5(c) and FIG. 6 are cross-sectional views illustrating a sequence of steps for fabricating a semiconductor laser device, which is a nitride semiconductor device, according to the second embodiment of the present invention.

In the first embodiment, an additional flatness maintenance layer made of a nitride semiconductor is provided under the active layer in order to improve the crystal quality of the active layer. In the present embodiment, a method for improving the quality of the active layer by providing appropriate process conditions without providing an additional nitride semiconductor layer will be described.

Figure 5A:
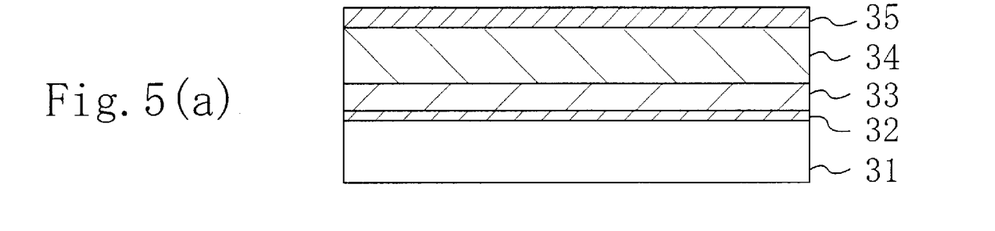

First, referring to FIG. 5(a), using an MOVPE method, a heat treatment at a temperature of about 1000° C. is performed on a substrate 31 made of sapphire which is held in a reaction chamber. Then, the substrate temperature is decreased to 500° C., and a buffer layer 32 made of GaN for reducing the lattice mismatch between the sapphire crystal forming the substrate 31 and the GaN-based semiconductor crystal to be grown on the substrate 31 and thus suppressing the occurrence of a defect in the GaN-based semiconductor crystal is grown on the substrate 31 by introducing TMG as a group III source and $NH_3$ as a nitrogen source onto the substrate 31 while using primarily an $H_2$ gas as the carrier gas and setting the growth pressure to be 1000 Torr (about 1.3 atm).

Then, the substrate temperature is increased to 1020° C., and $SiH_4$ containing an n-type dopant, TMG as a group III source and $NH_3$ as a nitrogen source are introduced so as to first grow, on the buffer layer 32, an n-type contact layer 33 made of n-type GaN which has a device formation region and an ohmic electrode formation region. Then, TMA is added to the group III source so as to grow an n-type cladding layer 34 made of n-type $Al_{0.1}Ga_{0.9}N$ for forming a potential barrier for an active layer to be described later to confine n-type carriers therein. Then, the introduction of TMA is stopped so as to grow an n-type optical guide layer 35 made of n-type GaN for confining light generated in the active layer.

Figure 5B:
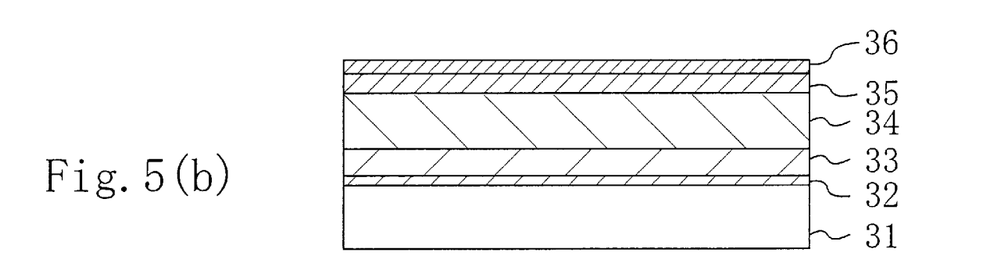

Then, referring to FIG. 5(b), the supply of the group III material gas is stopped, the substrate temperature is decreased to 820° C., and the carrier gas is switched from $H_2$ to $N_2$. At this point, the pressure in the reaction chamber is maintained at 1000 Torr. Then, an active layer 36 is grown by using $NH_3$ as a group V source and selectively introducing TMI and TMG as a group III source. Although not shown in the figures, the active layer 36 of the present embodiment has a multiple quantum well structure including well layers made of $Ga_{0.8}In_{0.2}N$ and each having a thickness of 3.0 nm which are grown while introducing TMI, and barrier layers made of GaN and each having a thickness of 7.5 nm which are grown while the introduction of TMI is stopped.

Figure 5C:
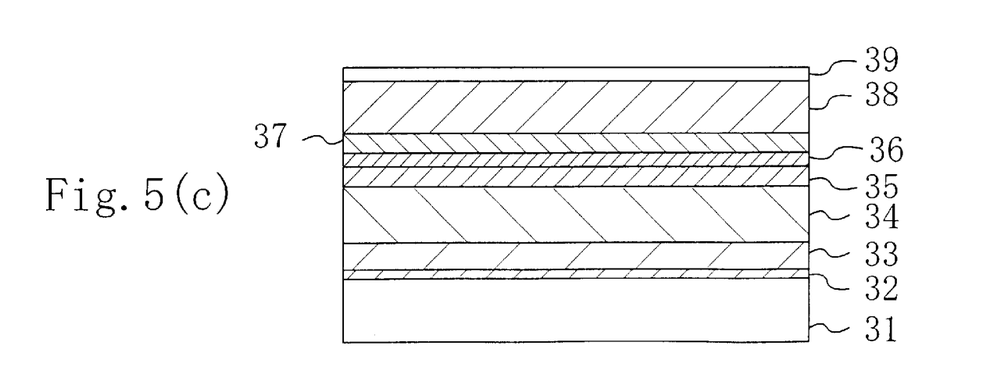

Then, referring to FIG. 5(c), the introduction of the group III material gas and the carrier gas is once stopped, and the substrate temperature is increased to 1020° C. Then the carrier gas is switched from an $N_2$ gas to an $H_2$ gas, and $Cp_2Mg$ containing a p-type dopant, TMG as a group III source and $NH_3$ as a nitrogen source are introduced so as to grow, on the active layer 36, a p-type optical guide layer 37 made of p-type GaN for confining light generated in the active layer 36. Then, TMA is added to the group III source so as to grow a p-type cladding layer 37 made of p-type $Al_{0.1}Ga_{0.1}N$ for forming a potential barrier for the active layer 36 to confine p-type carriers therein. Then, the introduction of TMA is stopped again so as to grow a p-type contact layer 39 made of p-type GaN which is to be in an ohmic contact with an electrode.

Figure 6:
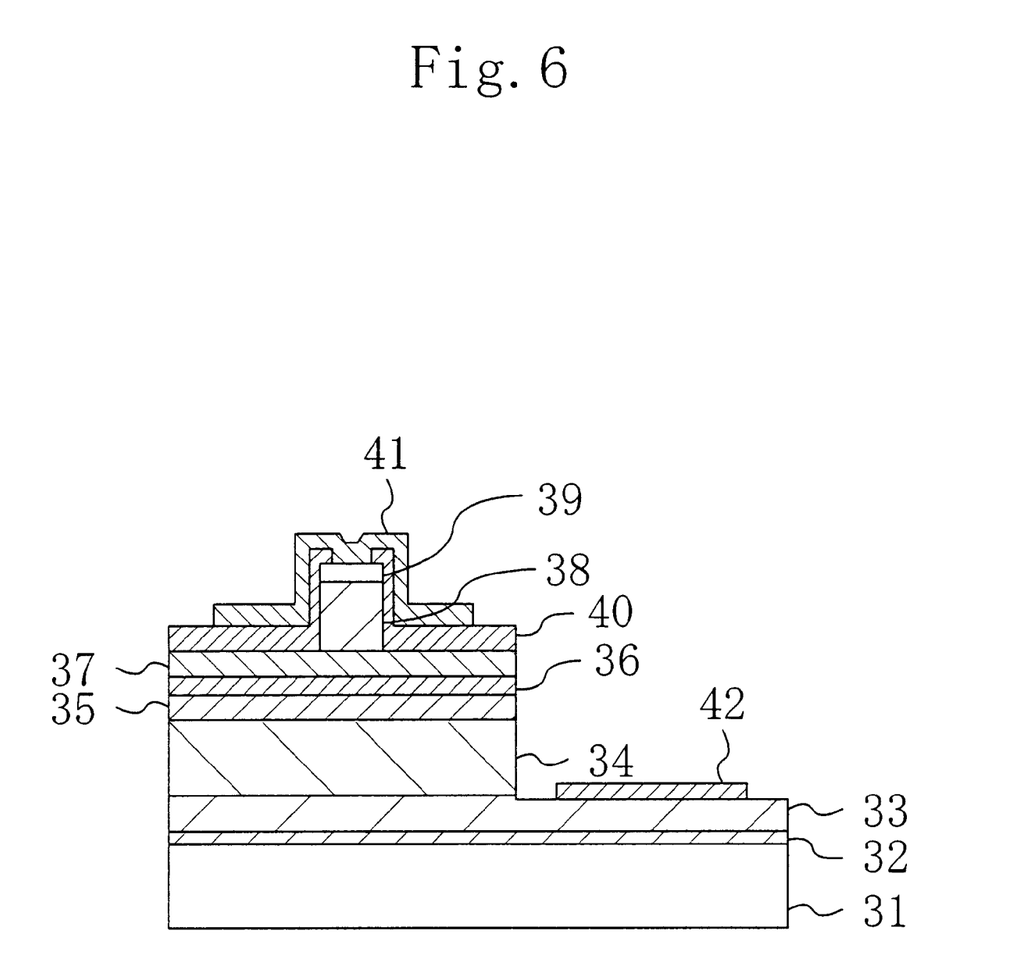
FIG. 6 is a cross-sectional view illustrating a sequence of steps of a method for fabricating a nitride semiconductor device according to the second embodiment of the present invention.

Then, referring to FIG. 6, the substrate 31 having the respective epitaxial layers formed thereon is taken out of the reaction chamber, and the p-type contact layer 39 and the p-type cladding layer 38 are etched to form the p-type contact layer 39 and the p-type cladding layer 38 into a ridge stripe shape having a width of about 5 µm. Then, an insulation film 40 made of silicon dioxide ($SiO_2$) is formed on the side walls of the p-type contact layer 39 and the p-type cladding layer 38 and in the region of the upper surface of the p-type optical guide layer 37 beside the p-type contact layer 39 and the p-type cladding layer 38 having the ridge stripe shape.

Then, a p-side electrode 41 made of a stack of Ni/Au, for example, is formed by using a vapor deposition method, or the like, in a region including the upper surface of the p-type contact layer 39. After etching is performed so as to expose the ohmic electrode formation region of the n-type contact layer 33, an n-side electrode 42 made of a stack of Ti/Al, for example, is formed by using a vapor deposition method, or the like, in the ohmic electrode formation region.

As a characteristic of the present embodiment, the respective growth steps for layers from the buffer layer 32 to the p-type contact layer 39 are performed under a pressurized condition with the pressure of the reaction chamber of the MOVPE apparatus being 1000 Torr (about 1.3 atm) and in a gas ambience containing nitrogen element.

The reason why the crystallinity and the flatness of the surface of a semiconductor layer provided in each growth step, particularly the crystallinity and the flatness of the n-type optical guide layer 35 located immediately under the active layer 36 containing In, are maintained at high levels when the material gas or the carrier gas is switched from one to another between steps of growing the respective semiconductor layers under a pressurized condition will now be described.

Regarding the n-type optical guide layer 35 to be the underlying layer for the active layer 36, the carrier gas is switched from an $H_2$ gas to an $N_2$ gas immediately before the step of growing the active layer 36 containing In is started. Since the relatively high growth temperature for the underlying layer needs to be decreased, the surface of the n-type optical guide layer 35 before growing the active layer 36 is exposed to a high temperature gas without a group III material being supplied. At this point, if the pressure is low, re-evaporation of the n-type optical guide layer 35 occurs, thereby causing problems, including an increase in an inherent defect such as nitrogen vacancy, a decrease in the flatness, and the like.

The present inventors have discovered that the re-evaporation of the constituent atoms forming the underlying layer from the underlying layer can be made less likely to occur, thereby obtaining a desirable crystal quality, if a gas ambience containing nitrogen element (e.g., $NH_3$) is used and a pressure of 1000 Torr, i.e., a pressurized condition exceeding 1 atm, is used when switching the material gas or the carrier gas carrying the material gas from one to another. It has been confirmed that the surface flatness and the crystal quality of the n-type optical guide layer 35 made of n-type GaN are thus improved, whereby the crystal quality of the active layer 36 grown on the n-type optical guide layer 35 having a desirable flatness and crystal quality is substantially improved from that when the growth step is carried out under a normal pressure, i.e., 1 atm (760 Torr) or under a depressurized condition.

Moreover, it has been confirmed that when a GaInN crystal is grown under a pressurized condition, it is also possible to reduce the inherent defect such as vacancy in the GaInN crystal.

For the growth of a GaInN mixed crystal, the growth temperature needs to be about 800° C., i.e., lower than that for a layer containing no In, as disclosed in, for example, Applied Physics Letters, vol. 59 or Japanese Laid-Open Patent Publication No. 6-196757 mentioned above. This is because particularly InN in GaInN is easily thermally decomposed. An $NH_3$ gas as a group V source, on the other hand, has a very high decomposition temperature. Therefore, when the temperature is about 800° C., the nitrogen atoms may no longer be efficiently taken into the GaInN crystal, thereby producing nitrogen vacancy. As described above, there is a trade-off relationship between the thermal decomposition of solid InN and that of an $NH_3$ gas.

Therefore, according to the fabrication method of the present embodiment, GaInN is grown under a pressurized condition, whereby it is possible to sufficiently control the thermal decomposition of solid InN and also to increase the number (density) of $NH_3$ to be introduced above the substrate 31, thus increasing the number of nitrogen atoms produced through thermal decomposition of $NH_3$. In an experiment by the present inventors, it has been confirmed through an optical evaluation such as photoluminescence that when a GaInN mixed crystal is grown under conditions under which an $NH_3$ gas is introduced onto the substrate 31, it is possible to substantially reduce the nitrogen vacancy and to improve the crystallinity of the GaInN mixed crystal, e.g., the active layer 36, if a pressurized condition exceeding 1 atm is used.

As a result of a measurement of the operating characteristics of a semiconductor laser device fabricated by using the fabrication method of the present embodiment, it has been shown that the threshold current is reduced to about ½ of that when a semiconductor laser device is fabricated by using a conventional method.

While a pressurized condition is used during the growth steps for the respective semiconductor layers and during the switching step between the growth steps in the present embodiment, a pressurized condition may alternatively be used only during the switching step.

While a GaN-based semiconductor laser device has been described as an example in the present embodiment, the present invention is not limited to this. Similar effects can be obtained also when forming an active region of a light-emitting diode device, an electronic device, or the like.

Moreover, it is understood that an active layer having a more desirable crystallinity can be obtained by forming a semiconductor laser device having the flatness maintenance layer as illustrated in the first embodiment by using the fabrication method of the second embodiment.

What is claimed is:

1. A method for fabricating a nitride semiconductor device, comprising the steps of:

forming a semiconductor layer made of a first nitride semiconductor on a substrate;

forming, on the semiconductor layer, a flatness maintenance layer made of a second nitride semiconductor for maintaining a surface flatness of the semiconductor layer by suppressing evaporation of constituent atoms of the semiconductor layer; and forming an active layer made of a third nitride semiconductor on the flatness maintenance layer.

2. The method for fabricating a nitride semiconductor device of claim 1, wherein the second nitride semiconductor includes aluminum, and the third nitride semiconductor includes gallium and indium.

3. The method for fabricating a nitride semiconductor device of claim 1, wherein the second nitride semiconductor is made of $Al_xGa_{1-x}N$ (where x satisfies $0.1<x\leq 1$).

4. The method for fabricating a nitride semiconductor device of claim 1, wherein the second nitride semiconductor is made of $Al_xGa_{1-x}N$ (where x satisfies $0.2\leq x\leq 1$).

5. The method for fabricating a nitride semiconductor device of claim 1, wherein a thickness of the flatness maintenance layer is approximately 0.5 µm or less.

6. A method for fabricating a nitride semiconductor device, comprising the steps of:

forming a first semiconductor layer made of a first nitride semiconductor on a substrate at a first growth temperature;

forming, on the first semiconductor layer, a flatness maintenance layer made of a second nitride semiconductor for maintaining a surface flatness of the first semiconductor layer by suppressing evaporation of constituent atoms of the first semiconductor layer; and forming a second semiconductor layer made of a third nitride semiconductor on the flatness maintenance layer at a second temperature lower than the first growth temperature.

7. The method for fabricating a nitride semiconductor device of claim 6, wherein the second nitride semiconductor is made of $Al_xGa_{1-x}N$ (where x satisfies $0.1<x\leq 1$).

8. The method for fabricating a nitride semiconductor device of claim 6, wherein the second nitride semiconductor is made of $Al_xGa_{1-x}N$ (where x satisfies $0.2\leq x\leq 1$).

9. The method for fabricating a nitride semiconductor device of claim 6, wherein a thickness of the flatness maintenance layer is approximately 0.5 µm or less.

10. A method for fabricating a nitride semiconductor device, comprising:

a first semiconductor layer formation step of introducing a group III material gas and a group V material gas onto a substrate, thereby forming a first semiconductor layer made of a first nitride semiconductor on the substrate;

a group III material gas stopping step of stopping the introduction of the group III material gas; and a second semiconductor layer formation step of introducing a group III material gas and a group V material gas onto the first semiconductor layer, thereby forming a second semiconductor layer made of a second nitride semiconductor on the first semiconductor layer, wherein the group III material gas stopping step includes the step of adjusting an ambience around the first semiconductor layer to be an ambience containing nitrogen and having a pressure of 1 atm or higher.

11. A method for fabricating a nitride semiconductor device, comprising:

a first semiconductor layer formation step of introducing a group III material gas and a group V material gas onto a substrate along with a first carrier gas, thereby forming a first semiconductor layer made of a first nitride semiconductor on the substrate;

a carrier gas changing step of changing the first carrier gas to a second carrier gas whose composition is different from that of the first carrier gas; and a second semiconductor layer formation step of introducing a group III material gas and a group V material gas onto the first semiconductor layer along with the second carrier gas, thereby forming a second semiconductor layer made of a second nitride semiconductor on the first semiconductor layer, wherein the carrier gas changing step includes the step of adjusting an ambience around the first semiconductor layer to be an ambience containing nitrogen and having a pressure of 1 atm or higher.

* * * * *

UNITED STATES PATENT AND TRADEMARK OFFICE
CERTIFICATE OF CORRECTION

PATENT NO. : 6,518,082 B1
DATED : February 11, 2003
INVENTOR(S) : Isao Kidoguchi et al.

It is certified that error appears in the above-identified patent and that said Letters Patent is hereby corrected as shown below:

<u>Title page,</u>
Item [56], References Cited, FOREIGN PATENT DOCUMENTS, insert
-- JP    9-186403    7/1997;
   JP    9-139543    5/1997;
   JP    9-129929    5/1997 --.

Signed and Sealed this

Twenty-ninth Day of June, 2004

JON W. DUDAS
*Acting Director of the United States Patent and Trademark Office*